US009502674B2

(12) United States Patent
Xiao

(10) Patent No.: US 9,502,674 B2
(45) Date of Patent: Nov. 22, 2016

(54) CARBON NANOTUBE NEURON DEVICE AND METHOD FOR MAKING THE SAME

(71) Applicant: SEMICONDUCTOR MANUFACTURING INTERNATIONAL (SHANGHAI) CORPORATION, Shanghai (CN)

(72) Inventor: Deyuan Xiao, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/980,531

(22) Filed: Dec. 28, 2015

(65) Prior Publication Data

US 2016/0190494 A1   Jun. 30, 2016

(30) Foreign Application Priority Data

Dec. 29, 2014   (CN) .......................... 2014 1 0856215

(51) Int. Cl.
| | |
|---|---|
| H01L 21/00 | (2006.01) |
| H01L 29/00 | (2006.01) |
| B82Y 10/00 | (2011.01) |
| H01L 51/05 | (2006.01) |
| H01L 51/00 | (2006.01) |
| H01L 51/10 | (2006.01) |
| H01L 21/02 | (2006.01) |
| H01L 29/06 | (2006.01) |

(52) U.S. Cl.
CPC ....... *H01L 51/0554* (2013.01); *H01L 51/0048* (2013.01); *H01L 51/0537* (2013.01); *H01L 51/0541* (2013.01); *H01L 51/0558* (2013.01); *H01L 51/105* (2013.01); *B82Y 10/00* (2013.01);CPC ...... *H01L 21/02603* (2013.01); *H01L 29/0669* (2013.01)

(58) Field of Classification Search
CPC ................ H01L 21/02606; H01L 21/823807; H01L 21/845; H01L 21/53276; H01L 21/02521; H01L 21/02603; H01L 29/0669; H01L 29/0673; H01L 29/785; H01L 29/0665; H01L 29/78696; H01L 51/0554; H01L 51/0541; H01L 51/0537; H01L 51/105; H01L 51/0048; H01L 51/0558; B82Y 10/00
See application file for complete search history.

(56) References Cited

U.S. PATENT DOCUMENTS

| | | | | |
|---|---|---|---|---|
| 6,972,467 | B2* | 12/2005 | Zhang | B82Y 10/00 257/401 |
| 6,974,738 | B2* | 12/2005 | Hareland | H01L 29/1054 257/E21.43 |
| 7,492,015 | B2* | 2/2009 | Chen | B82Y 10/00 257/369 |
| 9,287,516 | B2* | 3/2016 | Cao | H01L 51/0541 |
| 2005/0276093 | A1* | 12/2005 | Graham | B82Y 10/00 365/149 |
| 2009/0184346 | A1* | 7/2009 | Jain | B82Y 10/00 257/288 |
| 2015/0348911 | A1* | 12/2015 | Xiao | H01L 23/53276 257/751 |

OTHER PUBLICATIONS

Shibata, Tadashi, "A Functional MOS Transistor Featuring Gate-Level Weighted Sum and Threshold Operations", IEEE Transactions on Electron Devices, vol. 39, No. 6, Jun. 1992, 1444-1454.

* cited by examiner

*Primary Examiner* — Nikolay Yushin
(74) *Attorney, Agent, or Firm* — Kilpatrick Townsend & Stockton LLP

(57) ABSTRACT

A carbon nanotube neuron device and a method of making the same are provided. The carbon nanotube neuron device includes a substrate, an insulating layer formed on the substrate, and a carbon nanotube formed above the insulating layer. The carbon nanotube includes a source region, a drain region, and a channel region between the source region and the drain region. The carbon nanotube neuron device further includes a laminate structure surrounding the channel region. The laminate structure includes a first dielectric layer, a conductive layer, and a second dielectric layer. The carbon nanotube neuron device further includes a source electrode and a drain electrode disposed above the insulating layer and surrounding the source region and the drain region, respectively, and a plurality of gate electrodes spaced apart from each other and disposed above the insulating layer. Each gate electrode surrounds the laminate structure that surrounds the channel region.

19 Claims, 10 Drawing Sheets

CARBON NANOTUBE NEURON DEVICE AND METHOD FOR MAKING THE SAME

CROSS-REFERENCES TO RELATED APPLICATIONS

This application claims priority to Chinese patent application No. 201410856215.3, filed on Dec. 29, 2014, the content of which is incorporated herein by reference in its entirety. This application is also related to concurrently filed U.S. patent application Ser. No. 14/981,807, which claims priority to Chinese patent application No. 201410856188.X, filed on Dec. 29, 2014, and U.S. patent application Ser. No. 14/980,623, which claims priority to Chinese patent application No. 201410840374.X, filed on Dec. 29, 2014. All of the above applications are commonly owned and incorporated herein by reference in their entirety.

BACKGROUND OF THE INVENTION

The present invention relates to the field of semiconductors, in particular to a neuron device and a method of making the same.

With the development of integrated circuits and the improvements in the degree of integration, there have been many difficulties and unsolved problems with conventional silicon integrated circuits based on single transistor functionality. For example, the ability to further increase the density of components on a chip is limited. Neuron MOS transistors (Neuron Metal-Oxide Semiconductor Field Effect Transistor, abbreviated as neuMOS or vMOS) as powerful single-cell transistors provide an effective way of addressing the increasing number of transistors in integrated circuits and interconnection lines.

A neuron MOS transistor has a floating gate, which is capacitively coupled to the input terminal. The functionalities of a neuron device are similar to those of the nerve cells forming the human brain, the eye, and the like. Specifically, a neuron device provides a weighted sum of a plurality of input signals and outputs a predetermined signal when the resultant weighted sum of input signals reaches a predetermined threshold value. Such a neuron device includes a weighting tool for providing a weighted sum of a plurality of input signals. When the weighted sum of input voltages reaches a predetermined value, the source and the drain of the neuron device become conducting with respect to each other. The weighting tool is equivalent to a synapse between neuron cells. For example, the weighting tool may include resistors and field effect transistors. A neuron transistor is equivalent to the cell body of a neuron cell.

FIG. 12A shows a schematic diagram of a neuron MOS transistor. FIG. 12B shows an equivalent circuit diagram of a neuron MOS transistor with a floating gate and a plurality of input gates. FIG. 12C shows a simplified schematic diagram of a neuron MOS transistor. As shown in FIG. 12A, the neuron MOS transistor includes a substrate 1205, a source 1201, a drain 1202, a floating gate 1203, and a plurality of input gates 1204. As shown in FIG. 12B, each input electrode forms a respective equivalent capacitor with the floating gate, having a respective capacitance of $C_1, C_2, C_3, \ldots C_n$, respectively. The two plates of each respective capacitor have a charge of $Q_1, Q_2, Q_3, \ldots Q_n$, respectively. The floating gate and the substrate form an equivalent capacitor having a capacitance of $C_0$, and a charge of $Q_0$. Assuming there is no charge injection during device operation, the charge on the floating gate is the initial charge. In order to simplify, it is assumed that the initial charge is zero. Assuming that the substrate is grounded, by calculating the weighted sum of the input signals at the plurality of input electrodes, the electric potential of the floating gate is:

$$\Phi_F = \frac{\sum_{i=1}^{k} C_i V_i}{\sum_{i=1}^{k} C_i + C_0}$$

wherein, $\Phi_F$ is the floating gate potential, and $V_i$ is the voltage on each capacitor. When the floating gate potential $\Phi_F$ is greater than the threshold voltage $V_{th}$, the source 1201 and the drain 1203 is turned on.

Such a neuron MOS transistor has many uses. It can be used as an inverter. For example, one may connect the source electrode (or the drain electrode) of the neuron MOS transistor to a power source $V_{DD}$ via a resistor, connect the drain electrode (or the source electrode) to the ground, and use the plurality of input gates as input. When the floating gate potential $\Phi_F$ is greater than the threshold voltage $V_{th}$, the inverter outputs a logic "0"; and when $\Phi_F$ is greater than $V_{th}$, the inverter outputs a logic "1."

SUMMARY OF THE INVENTION

In one aspect of the present invention, a carbon nanotube neuron device includes a substrate, an insulating layer formed on the substrate, and a carbon nanotube formed above the insulating layer. The carbon nanotube includes a source region on one end thereof, a drain region on another end thereof, and a channel region between the source region and the drain region. The source region and the drain region are doped to a same conductivity type. The carbon nanotube neuron device further includes a laminate structure surrounding the channel region. The laminate structure includes, from inside to outside, a first dielectric layer, a conductive layer, and a second dielectric layer. The carbon nanotube neuron device further includes a source electrode and a drain electrode disposed above the insulating layer and surrounding the source region and the drain region, respectively, and a plurality of gate electrodes spaced apart from each other and disposed above the insulating layer. Each gate electrode surrounds the laminate structure that surrounds the channel region. The carbon nanotube is disposed above the insulating layer and supported by the source electrode, the drain electrode, or the plurality of gate electrodes.

According to an embodiment, the channel region is of intrinsic type, and the source region and the drain region are both lightly doped n-type, or both lightly doped p-type, or both heavily doped n+ type, or both heavily doped p+ type. According to another embodiment, the channel region is lightly doped n-type, and the source region and the drain region are both heavily doped n+ type, or both lightly doped p-type, or both heavily doped p+ type. According to yet another embodiment, the channel region is lightly doped p-type, and the source region and the drain region are both heavily doped p+ type, or both lightly doped n-type, or both heavily doped n+ type.

According to an embodiment, the carbon nanotube neuron device further includes: disposed between each gate electrode and the insulating layer, from bottom to top, a third dielectric layer, a second conductive layer, and a fourth dielectric layer.

According to an embodiment, the carbon nanotube has a length ranging from about 50 nm to about 500 nm, and a spacing between adjacent gate electrodes ranges from about 10 nm to about 50 nm.

According to an embodiment, each of the first dielectric layer and the second dielectric layer has a thickness ranging from about 1 nm to about 3 nm, and the conductive layer has a thickness ranging from about 2 nm to about 10 nm.

According to an embodiment, the carbon nanotube has a diameter ranging from about 1 nm to about 3 nm.

According to an embodiment, the first dielectric layer and the second dielectric layer include a high-k dielectric material, and the conductive layer includes polycrystalline silicon or a metal material.

In another aspect of the present invention, a method of forming a carbon nanotube neuron device includes: providing a substrate; forming an insulating layer on the substrate; forming a carbon nanotube above the insulating layer; and forming a laminate structure surrounding the carbon nanotube. The laminate structure includes, from inside to outside, a first dielectric layer, a conductive layer, and a second dielectric layer. The method further includes forming a plurality of gate electrodes spaced apart from each other and disposed above the insulating layer. Each gate electrode surrounds the laminate structure. The method further includes: removing a portion of the laminate structure surrounding each end of the carbon nanotube to form a source region and a drain region in each end of the carbon nanotube, respectively; forming a source electrode surrounding the source region and located above the insulating layer; and forming a drain electrode surrounding the drain region and located above the insulating layer. The carbon nanotube is disposed above the insulating layer and supported by the source electrode, the drain electrode, or the plurality of gate electrodes.

According to an embodiment, forming the carbon nanotube above the insulating layer includes: forming a porous silicon layer on the insulating layer; forming a photoresist layer with an opening on the porous silicon layer; applying a metal catalyst solution through the opening; baking the metal catalyst solution to form metal nanoparticles on the porous silicon layer; removing the photoresist layer; causing a chemical reaction between the metal nanoparticles and a carbon-based compound to form the carbon nanotube on the porous silicon layer; and removing a portion of the porous silicon layer to expose a portion of the insulating layer, such that the carbon nanotube is supported by a remaining portion of the porous silicon layer.

According to an embodiment, removing the portion of the laminate structure surrounding each end of the carbon nanotube includes removing the remaining portion of the porous silicon layer.

According to an embodiment, causing a chemical reaction between the metal nanoparticles and a carbon-based compound to form the carbon nanotube includes adding ammonia to the carbon nanotube being formed to perform n-type doping, or adding borane to the carbon nanotube being formed to perform p-type doping.

According to an embodiment, forming the laminate structure surrounding the carbon nanotube includes: forming the first dielectric layer surrounding the carbon nanotube using atomic layer deposition; forming the conductive layer surrounding the first dielectric layer using low pressure chemical vapor deposition; and forming the second dielectric layer surrounding the conductive layer using atomic layer deposition.

According to an embodiment, forming the laminate structure includes forming a second laminate structure on the exposed portion of the insulating layer and the remaining portion of the porous silicon layer by: forming a third dielectric layer on the exposed portion of the insulating layer and the remaining portion of the porous silicon layer; forming a second conductive layer on the third dielectric layer; and forming a fourth dielectric layer on the second conductive layer.

According to an embodiment, the plurality of gate electrodes spaced apart from each other are formed above the second laminate structure formed on the exposed portion of the insulating layer.

According to an embodiment, the porous silicon layer has a thickness ranging from about 2 nm to about 10 nm.

According to an embodiment, the first dielectric layer and the second dielectric layer comprises a high-k dielectric material, and the conductive layer comprises polycrystalline silicon or a metal material.

According to an embodiment, forming the source electrode or the drain electrode includes: forming a contact surrounding the carbon nanotube in the source region or the drain region using a first metal material by an evaporation and lift-off process, thereby forming the source electrode or the drain electrode. The first metallic material is in contact with the carbon nanotube such that the source region or the drain region of the carbon nanotube is lightly doped n-type or heavily doped n+ type. In another embodiment, forming the source electrode or the drain electrode includes forming a contact surrounding the carbon nanotube in the source region or the drain region using a second metal material by an evaporation and lift-off process, thereby forming the source electrode or the drain electrode. The second metallic material is in contact with the carbon nanotube such that the source region or the drain region of the carbon nanotube is lightly doped p-type or heavily doped p+ type.

According to an embodiment, the first metal material comprises Ca (calcium), Sc (scandium), or Y (yttrium); and the second metal material comprises Pb (lead), or Au (gold).

According to an embodiment, the method further includes: before forming the source electrode and the drain electrode, doping the source region and the drain region to a same conductivity type.

Embodiments of the present invention use a carbon nanotube as the channel region, the source region, and the drain region of the neuron device. Furthermore, the carbon nanotube neuron device according to embodiments of the present invention includes a laminate structure surrounding the channel region, a plurality of gate electrodes surrounding the laminate structure as multiple input gates, and a source electrode and a drain electrode surrounding the source region and the drain region of the carbon nanotube, respectively. The carbon nanotube is supported by the source electrode, the drain electrode, or the gate electrodes to be located above the insulating layer. As such, the gates of the carbon nanotube neuron device have enhanced control over the channel. In addition, the short-channel effects are avoided; the device structure is simpler; and the manufacturing process is more optimized.

The following description, together with the accompanying drawings, will provide a better understanding of the nature and advantages of the claimed invention.

DETAILED DESCRIPTION OF THE INVENTION

Figure 1:
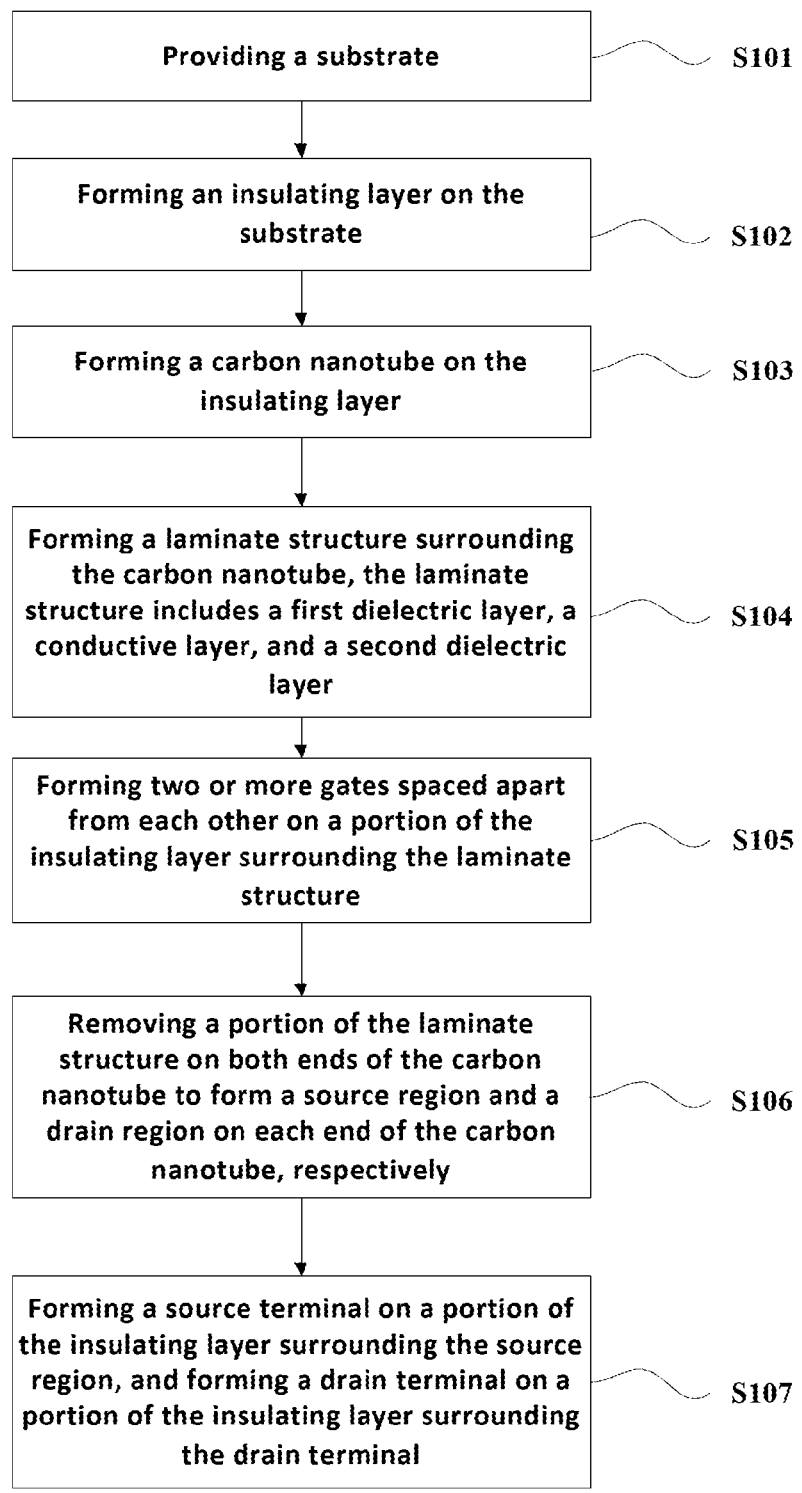
FIG. 1 is a simplified flowchart showing a method of forming a carbon nanotube neuron device according to an embodiment of the present invention.

The present invention will be described with respect to particular embodiments and with reference to certain drawings, but the invention is not limited thereto but only by the claims. It is noted that, unless otherwise specified, the relative arrangement of elements and steps set forth in the embodiments, numeric expressions and values shall not be construed as limiting the scope of the present invention.

The drawings described are only schematic and are non-limiting. In the drawings, the size of some of the elements may be exaggerated and not drawn to scale for illustrative purposes.

The following description of at least one embodiment is merely illustrative, and should not construed as limiting the present invention and its applications or use.

Method and devices known to people of skill in the art will not be discussed in detail for the sake of brevity. The conventional known techniques, methods and equipment should be considered as part of this disclosure.

Specific values provided in the exemplary embodiments shown and described herein should be construed as illustrative and not limiting. Thus, other exemplary embodiments may have different values.

It should be noted that like reference numerals and letters refer to similar items in the following figures. Thus, once an element is defined in one of the figures, it will not be further described in subsequent figures.

It will be understood that when an element is referred to as being "connected" to another element, it can be directly connected to other elements or intervening elements may be present. In contrast, when an element is referred to as being "directly connected to" another element, there are no intervening elements present.

Spatially relative terms, such as "beneath", "below", "lower", "above", "upper", "on" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, a term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

FIG. 1 is a simplified flowchart showing a method of forming a carbon nanotube neuron device according to an embodiment of the present invention.

In step S101, a substrate is provided. For example, the substrate 201 shown in FIG. 2 may be a silicon substrate.

In step S102, an insulating layer is formed on the substrate. For example, the insulating layer 202 shown in FIG. 2 may be a silicon dioxide layer. The insulating layer 202 may be formed, for example, by oxidation or a deposition process on the substrate 201. The thickness of the insulating layer 202 may be 10 to 100 nm (nanometers), for example, 30 nm, 50 nm, or 80 nm.

In step S103, a carbon nanotube is formed on the insulating.

In step S104, a laminate structure is formed surrounding the carbon nanotube. The laminated structure includes, in the order from the inside to the outside, a first dielectric layer, a conductive layer, and a second dielectric layer.

In step S105, two or more gates spaced apart from each other are formed on a portion of the insulating layer surrounding the laminate structure.

In step S106, a portion of the laminate structure is removed at both ends of the carbon nanotube to form a source region and a drain region at each end of the carbon nanotube, respectively.

In step S107, a source electrode is formed on the insulating layer surrounding the source region. A drain electrode is formed on the insulating layer surrounding the drain region.

Furthermore, the carbon nanotube is supported by the drain electrode and the source electrode and is located above the insulating layer.

In the carbon nanotube neuron device formed by the above method, the portion of the carbon nanotube between the source region and the drain region forms the channel region. Since the gate electrodes surround the channel region, the gate electrode in the carbon nanotube neuron device has enhanced control over the channel. Also, the short-channel effects are avoided; the device structure is simpler; and the manufacturing process is more optimized.

Below with reference to FIGS. 2 to 4, 5A and 5B, and 6A and 6B, the process forming a carbon nanotube on the insulating layer is described.

Figure 2:
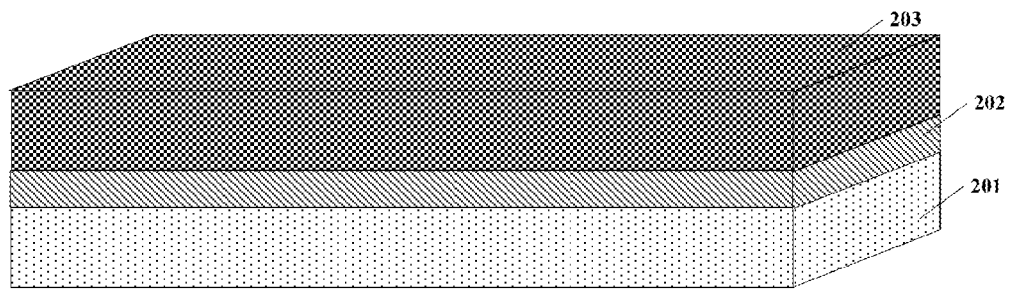
FIG. 2 is a schematic perspective view illustrating an intermediate stage of forming a carbon nanotube neuron device according to an embodiment of the present invention.

First, a porous silicon layer 203 is formed on the insulating layer 202, as shown in FIG. 2.

For example, the porous silicon layer may be formed by electrolytic etching of polysilicon. The electrolytic etching method includes the steps of: depositing a heavily doped polysilicon on the insulating layer 202, and electrolytic etching the polysilicon to form a porous silicon layer 203 (as shown in FIG. 2). The thickness of the porous silicon layer 203 may be, for example, 2 to 10 nm, for example, 3 nm, 5 nm or 8 nm.

As another example, one may use electrochemical etching (anodic etching) to form a porous silicon layer. The electrochemical etching method includes the steps of: inserting the silicon wafer into the holder located in the middle of a electrolyzer cell containing an etching solution. The silicon wafer divides the electrolyzer cell into two independent cells. The method further includes placing two electrodes facing each other on each side of the wafer, respectively, as the cathode and anode. After applying a voltage to the electrodes, due to the electric field, an electric current flows through the silicon substrate from one "half-cell" to the other "half-cell", and the holes in the substrate flow toward the silicon surface facing the cathode, thereby causing electrochemical corrosion of the substrate surface facing the cathode, while the substrate surface facing the anode is almost unchanged. By changing the size of the corrosion current, one can get pores of different sizes. By changing the etching time, one can obtain a porous silicon layer of different thicknesses.

As another example, the porous silicon layer can be formed using a photochemical process. The photochemical process includes the steps of: under the action of light, a silicon wafer immersed in a hydrofluoric acid (HF) aqueous solution or an HF ethanol solution may react with HF. The light produces non-equilibrium carriers in the silicon wafer, providing electrons and holes necessary for the reaction, accelerating the reaction speed of the surface. In this method, if the wavelength of the incident light is too long, the photon energy may be less than the band gap of silicon so that the photons cannot produce electron-hole pairs; if the wavelength of the incident light is too short, the large absorption by the wafer surface will affect the electron-hole pair yield. So one may use a 1.5-mW helium-neon laser to irradiate an n-type silicon. The wavelength of the irradiation from a helium-neon laser is about 632.8 nm. One can use a lens to expand the radius of the light irradiation. For example, an HF ethanol solution may have a volume ratio V (HF):V (C2H5OH)=1:1. The etching time may be 180 minutes.

As another example, the porous silicon layer may be formed by an etching method. The etching method includes the steps of: spraying a solution of HF acid through a nozzle to the surface of the silicon substrate, thereby forming the porous silicon layer.

As another example, the porous silicon layer can be formed by a hydrothermal etching method. The hydrothermal etching method includes the steps of: cleaning the wafer, soaking the single crystalline silicon wafer in acetone or ethanol for 15 minutes to remove organic contaminants attached to the surface, and then repeatedly rinsing with distilled water. Then the wafer is fixed to the inner core of a high-pressure water autoclave; then a prepared etching solution (HF acid, HF+HNO3 solution, etc.) is injected, followed by a heat treatment at 100 to 250° C. for 1 to 3 hours. After being cooled down to room temperature, the sample is removed from the water autoclave, soaked in distilled water, washed, and then dried naturally in air at room temperature.

Figure 3:
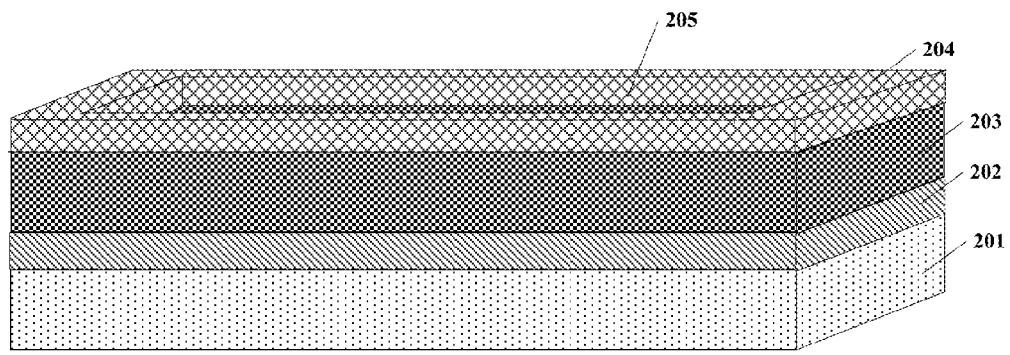
FIG. 3 is a schematic perspective view illustrating an intermediate stage of forming a carbon nanotube neuron device according to an embodiment of the present invention.

Then, a photoresist layer 204 with an opening 205 is formed on the porous silicon layer 203, and the metal catalyst solution is applied through the opening 205, as shown in FIG. 3.

For example, in this step, as shown in FIG. 3, first a photoresist layer is formed on the porous silicon layer 203; and an opening 205 is formed by photolithography in an area of the photoresist layer 204 where the carbon nanotube will be formed. The opening 205 exposes the porous silicon layer in the region. Finally, a metal catalyst solution is injected into the exposed region of the porous silicon layer through the opening.

According to an embodiment of the present invention, as shown in FIG. 3, if it is desired to form the carbon nanotube on the central region of the photoresist layer 204, photolithography can be performed on the central region of the photoresist later, thereby forming an opening to expose the porous silicon layer in the region. Those skilled in the art should appreciate that the shape of the opening in the photoresist layer 204 shown in FIG. 3 is not limited to a rectangle; it may have other shapes, e.g., an oval. Furthermore, one skilled in the art will appreciate that the position of the opening shown in FIG. 3 is not limited to the center of the photoresist layer 204, but may be in other locations, e.g., on the upper or lower side of the photoresist layer 204.

According to an embodiment of the present invention, the metal catalyst may include at least one of platinum, gold, silver, copper, nickel, and the like. Of course, the scope of the present invention is not limited thereto.

Figure 4:
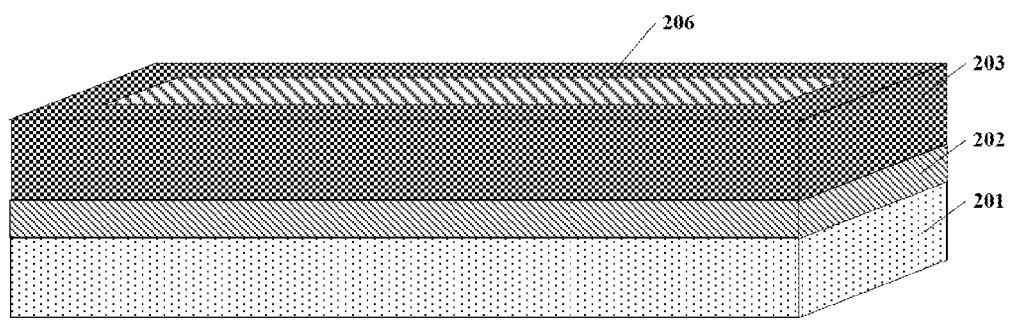
FIG. 4 is a schematic perspective view illustrating an intermediate stage of forming a carbon nanotube neuron device according to an embodiment of the present invention.

Next, the structure is baked and the photoresist layer 204 is removed, as shown in FIG. 4.

For example, in this step, shown in FIG. 4, after the metal catalyst solution is injected through the opening into the exposed porous silicon layer 203, the metal catalyst solution may be baked in a hydrogen or nitrogen environment, so that the water in the solution evaporates, thereby forming the metal nanoparticles. The diameters of the metal nanoparticles may be, for example, 3 nm or less. The metal nanoparticles will serve as metal catalyst in the formation of the carbon nanotube to be described below.

After baking, the photoresist layer 203 is removed, thereby forming a metal nanoparticle layer 206 on the porous silicon layer 203. As shown in FIG. 4, the entire photoresist layer 203 on the porous silicon layer 204 is removed, and a metal nanoparticle layer 206 is formed in the central region of the porous silicon layer 203.

Figure 5A:
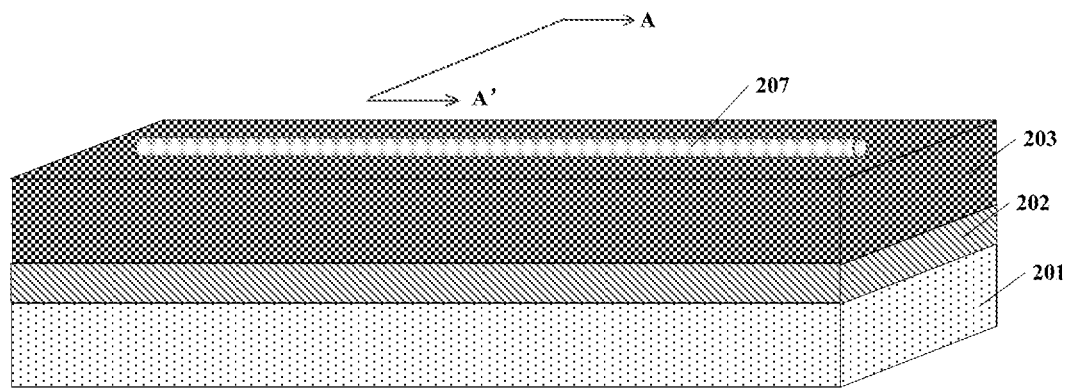
FIG. 5A is a schematic perspective view illustrating an intermediate stage of forming a carbon nanotube neuron device according to an embodiment of the present invention.
Figure 5B:
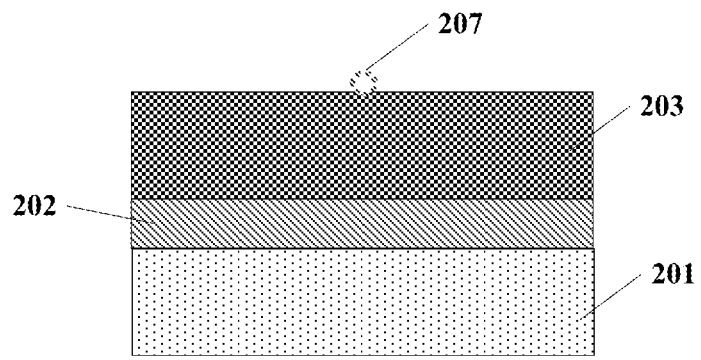
FIG. 5B is a schematic cross-sectional view along the A-A' direction of FIG. 5A, illustrating an intermediate stage of forming a carbon nanotube neuron device according to an embodiment of the present invention.

Next, using chemical reaction of the metal catalyst with a carbon-based compound, a carbon nanotube 207 is formed on the porous silicon layer 203, as shown in FIGS. 5A and 5B.

For example, in this step, as shown in FIGS. 5A and 5B, a carbon nanotube 207 may be formed on the surface of the porous silicon layer 203, through the chemical reaction of the metal catalyst with a carbon-based compound. Various methods may be used to cause the chemical reaction of the metal catalyst with a carbon-based compound to form a carbon nanotube 207. For example, chemical vapor deposition (CVD) may be used, for example at a temperature of 800 to 1000° C. (e.g. 900° C.), to cause a chemical reaction with the carbon-based compound in the CVD chamber to form a carbon nanotube 207. Those skilled in the art should appreciate that the above-mentioned chemical vapor deposition method is only exemplary; other ways may also be employed to cause a chemical reaction of the metal catalyst with a carbon-based compound to form a carbon nanotube 207.

For example, the carbon-based compound may include at least one of methane, ethylene, acetylene, carbon monoxide and benzene. Those skilled in the art should appreciate that other types of carbon-based compounds may also be used, as long as it can react with the metal catalyst to form a carbon nanotube.

For example, the carbon nanotube may be a single-walled carbon nanotube. Any metal particle with a diameter less than 3 nanometers (examples include copper, gold, silver and other precious metals and iron group elements, etc.) can produce single-walled carbon nanotubes.

In an embodiment of the present invention, the carbon nanotube has a diameter of 1 to 3 nm, e.g. 1.5 nm, 2 nm, or 2.5 nm. The length of the carbon nanotube may be 50 to 500 nm, such as 100 nm, 200 nm, 300 nm, or 400 nm.

In an embodiment of the present invention, the method of using a chemical reaction of the metal catalyst with a carbon-based compound to form a carbon nanotube on the porous silicon layer further includes: adding ammonia to perform n-type doping on the carbon nanotube being formed, or adding borane to perform p-type doping on the carbon nanotube being formed, thereby forming an n-type or a p-type carbon nanotube. In another embodiment, an n-type or a p-type carbon nanotube may be formed by directly doping an already formed carbon nanotube.

Figure 6A:
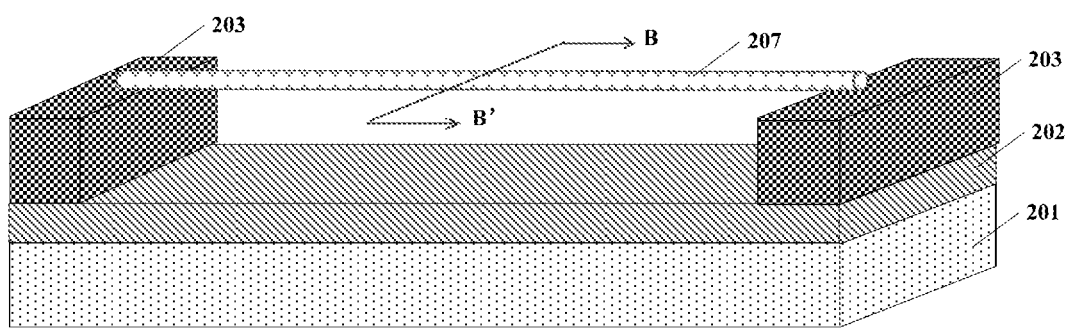
FIG. 6A is a schematic perspective view illustrating an intermediate stage of forming a carbon nanotube neuron device according to an embodiment of the present invention.
Figure 6B:
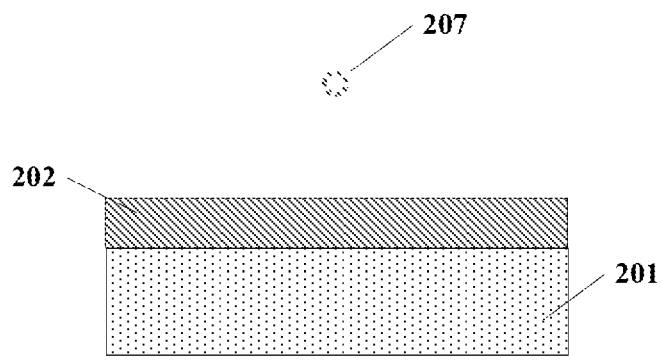
FIG. 6B is a schematic cross-sectional view along the B-B' direction of FIG. 6A, illustrating an intermediate stage of forming a carbon nanotube neuron device according to an embodiment of the present invention.

Next, a portion of the porous silicon layer 203 is removed to expose a portion of the insulating layer 202, so that the two ends of the carbon nanotube 207 are supported by the remaining porous silicon layer 203, as shown in FIGS. 6A and 6B.

For example, in this step, as shown in FIGS. 6A and 6B, a portion of the porous silicon layer 203 below the carbon nanotube 207 may be removed by photolithography; for example, the portion of the porous silicon layer 203 other than the portion below the two ends of the carbon nanotube is removed, leaving only the portions of the porous silicon layer 203 located under the two ends of the carbon nanotube, so that only the two ends of the carbon nanotube 207 are supported by the remaining porous silicon layer 203. As those skilled in the art would understand, the portion of the porous silicon layer 203 to be removed may be determined according to necessity, as long as the remaining porous silicon layer 203 can support both ends of the carbon nanotube 207.

Thus, a process of forming a carbon nanotube on the insulating layer has been described.

Returning to step S104 shown in FIG. 1, next, a laminate structure surrounding the carbon nanotube is formed. The laminate structure includes, in the order from the inside to the outside, a first dielectric layer, a conductive layer, and a second dielectric layer.

Figure 7A:
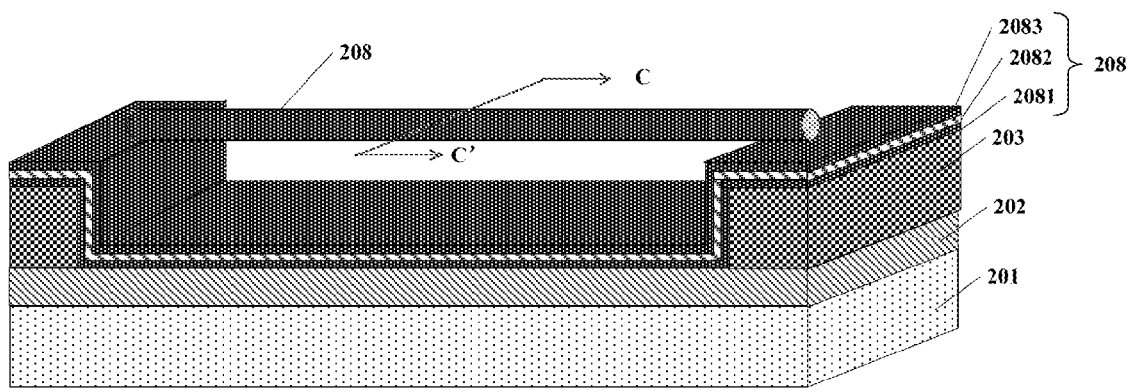
FIG. 7A is a schematic perspective view illustrating an intermediate stage of forming a carbon nanotube neuron device according to an embodiment of the present invention.
Figure 7B:
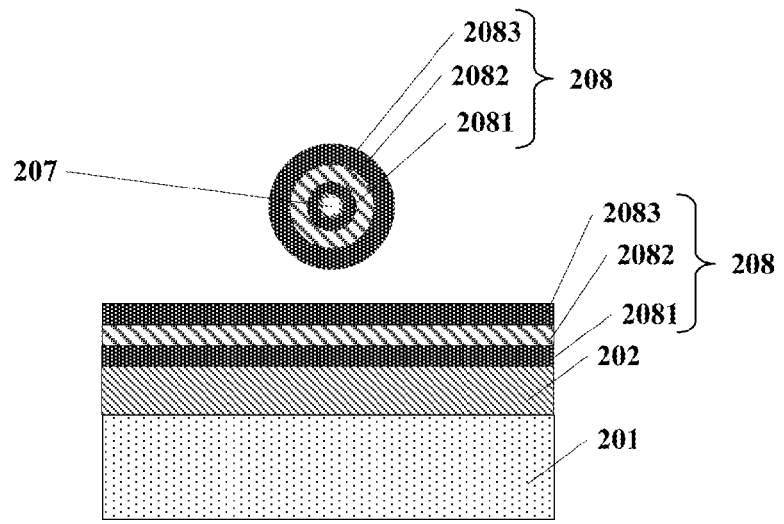
FIG. 7B is a schematic cross-sectional view along the C-C' direction of FIG. 7A, illustrating an intermediate stage of forming a carbon nanotube neuron device according to an embodiment of the present invention.

In an embodiment of the present invention, as shown in FIGS. 7A and 7B, the process of forming the laminate structure 208 surrounding the carbon nanotube 207 includes: forming a first dielectric layer 2081 surrounding the carbon nanotube 207 using atomic layer deposition; depositing a conductive layer 2082 (i.e., floating gate) surrounding the first dielectric layer 2081 by low pressure chemical vapor deposition; and forming a second dielectric layer 2083 surrounding the conductive layer 2082 by atomic layer deposition. For example, the thickness of the first dielectric layer 2081 and the second dielectric layer 2083 may be both 1 to 3 nm, e.g. 1.5 nm, 2 nm, or 2.5 nm; the thickness of the conductive layer 2082 may be 2 to 10 nm, e.g. 3 nm, 5 nm, or 8 nm.

In an embodiment of the present invention, the method of forming the laminate structure 208 surrounding the carbon nanotube 207 further includes: sequentially forming the first dielectric layer 2081, the conductive layer 2082, and the second dielectric layer 2083 on a portion of the insulating layer 202 and the remaining portion of the porous silicon layer 203.

In an embodiment of the present invention, the first dielectric layer and the second dielectric layer may include a dielectric material of a high dielectric constant (i.e. high k dielectric material); the conductive layer may include polysilicon or a metal material (e.g., aluminum, tungsten, etc.).

Figure 8A:
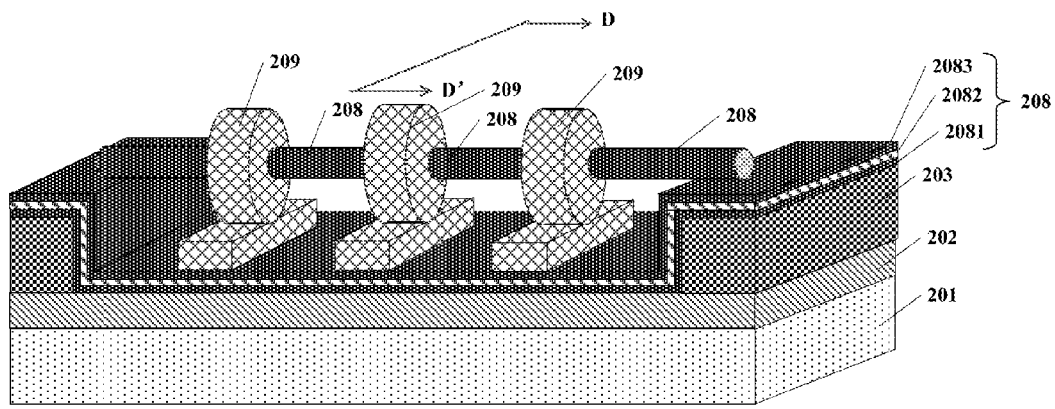
FIG. 8A is a schematic perspective view illustrating an intermediate stage of forming a carbon nanotube neuron device according to an embodiment of the present invention.
Figure 8B:
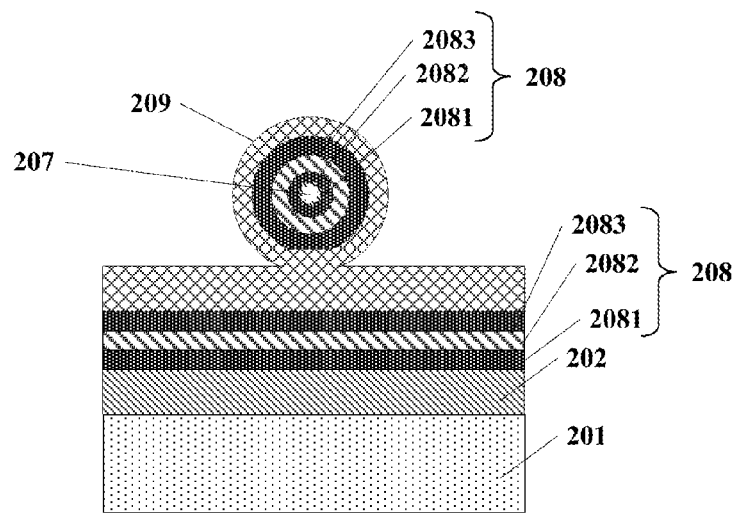
FIG. 8B is a schematic cross-sectional view along the D-D' direction of FIG. 8A, illustrating an intermediate stage of forming a carbon nanotube neuron device according to an embodiment of the present invention.

Next, in step S105, two or more gates spaced apart from each other are formed on a portion of the insulating layer and surrounding the laminate structure. In an embodiment of the present invention, as shown in FIGS. 8A and 8B, a method of forming the two or more (e.g., three) gates 209 spaced apart from each other on a portion of the insulating layer 202 and surrounding the second dielectric layer 2083 includes, for example, depositing a gate material, and then forming a gate electrode using a photolithography process. In another embodiment, the method includes first removing a portion of the laminate structure 208 on the insulating layer 202 using lithography, and then forming the two or more gates 209 spaced apart from each other directly on the portion of the insulating layer 202. For example, the spacing between adjacent gates may be 10 to 50 nm, for example 20 nm, 30 nm, or 40 nm. The following steps will be described in the example where the laminate structure above the insulating layer 202 is retained. Of course, those skilled in the art will appreciate that the following steps may be performed without the laminate structure on the insulating layer 202.

Figure 9A:
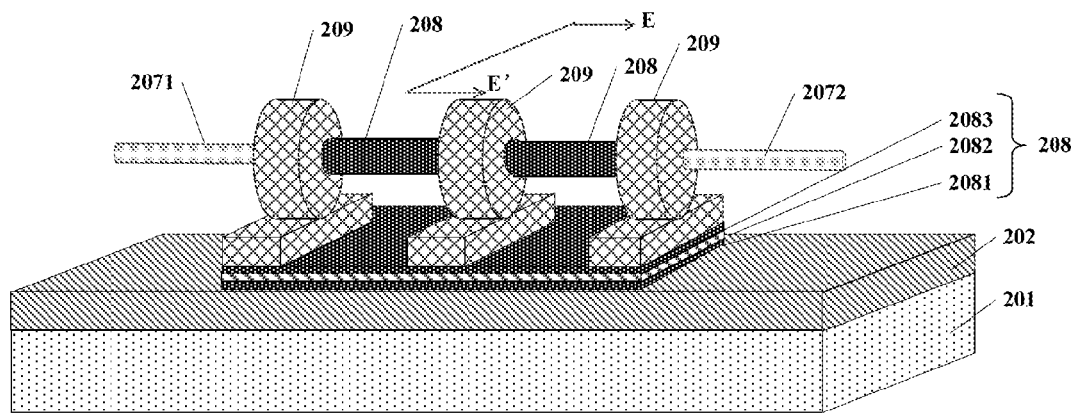
FIG. 9A is a schematic perspective view illustrating an intermediate stage of forming a carbon nanotube neuron device according to an embodiment of the present invention.
Figure 9B:
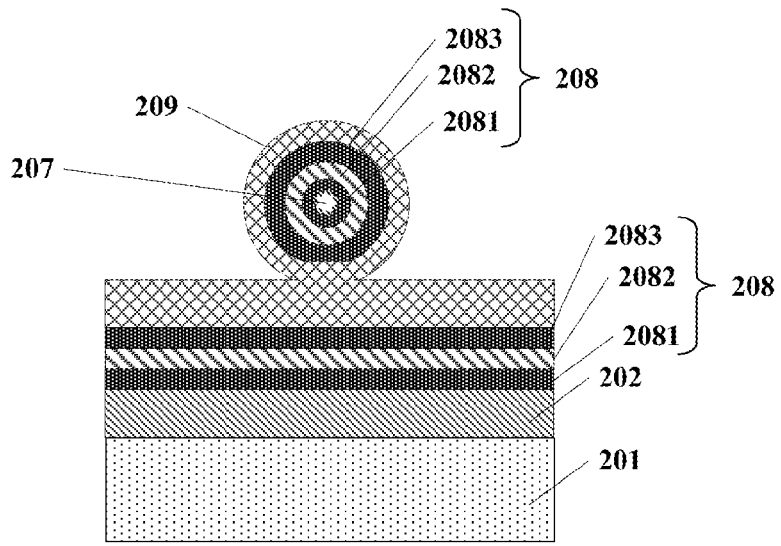
FIG. 9B is a schematic cross-sectional view along the E-E' direction of FIG. 9A, illustrating an intermediate stage of forming a carbon nanotube neuron device according to an embodiment of the present invention.

Next, at step S106, a portion of the laminate structure is removed at both ends of the carbon nanotube to form a source region and a drain region at each end of the carbon nanotube, respectively. For example, as shown in FIGS. 9A and 9B, a method may include: protecting the portion of the laminate structure that will not be removed using a photoresist, then removing portions of the laminate structure not covered by the photoresist at both ends of the carbon nanotubes 207 to form a source region 2071 and a drain region 2072 at each end of the nanotube, respectively; and then removing the photoresist, thereby forming the structure shown in FIG. 9A. The part of the carbon nanotube between the source region 2071 and the drain region 2072 is a channel region, i.e. the remaining part of the carbon nanotube surrounded by the laminate structure is a channel region. Of course, in this step, the process of removing portions of the laminate structure on two ends of the carbon nanotube may further include: removing the remaining porous silicon layer 203.

Next, at step S107, a source electrode is formed on a portion of the insulating layer surrounding the source region (e.g., surrounding a portion of the source region), and a drain electrode is formed on a portion of the insulating layer surrounding the drain region (e.g., surrounding a portion of the drain region).

Figure 10A:
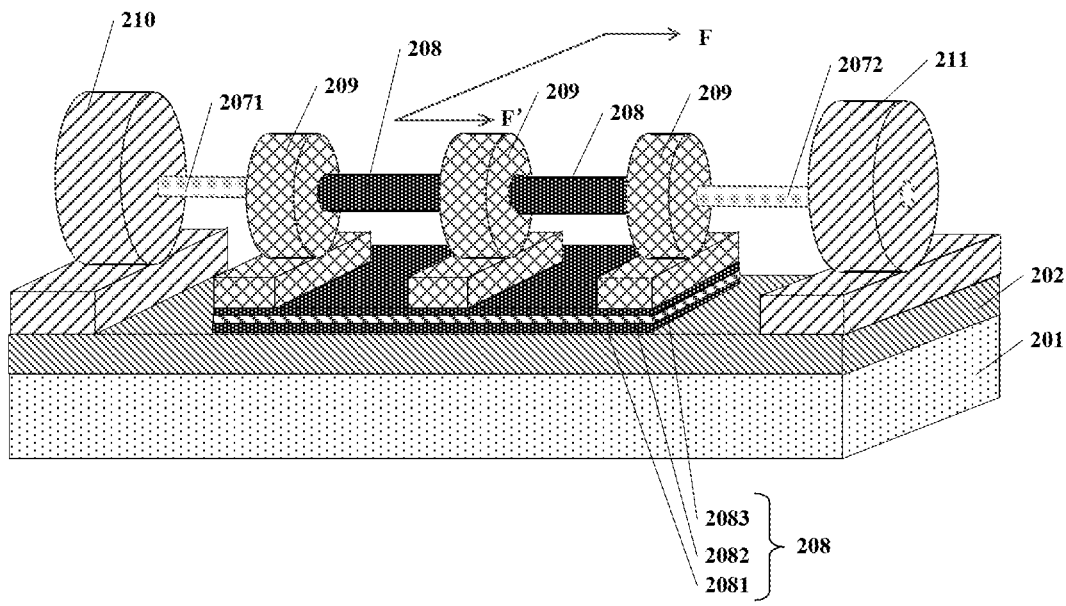
FIG. 10A is a schematic perspective view illustrating an intermediate stage of forming a carbon nanotube neuron device according to an embodiment of the present invention.
Figure 10B:
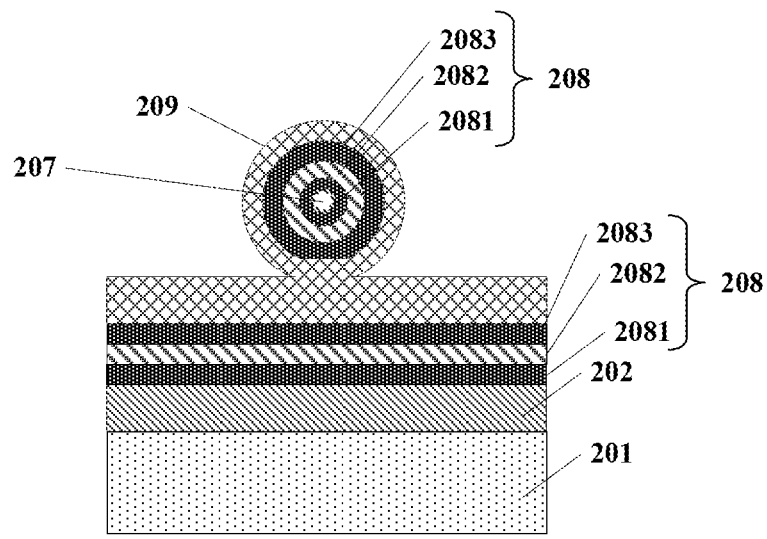
FIG. 10B is a schematic cross-sectional view along the F-F' direction of FIG. 10A, illustrating an intermediate stage of forming a carbon nanotube neuron device according to an embodiment of the present invention.

In an embodiment of the present invention, as shown in FIGS. 10A and 10B, the method includes using a first metal material to form contacts in the source region 2071 and the drain region 2072 surrounding the carbon nanotube 207 by an evaporation and lift-off process, thereby forming the source electrode 210 and the drain electrode 211, wherein the first metallic material is in contact with the carbon nanotube such that the source region 2071 and drain region 2072 of the carbon nanotube are lightly doped n-type or heavily doped n+ type. Alternatively, the method includes using a second metal material to form contacts in the source region 2071 and the drain region 2072 surrounding the carbon nanotube 207 by an evaporation and lift-off process, thereby forming the source electrode 210 and the drain electrode 211, wherein the second metallic material is in contact with the carbon nanotube such that the source region 2071 and drain region 2072 of the carbon nanotube are lightly doped p-type or heavily doped p+ type. For example, the first metal material may include: Ca (calcium), Sc (scandium), Y (yttrium) and the like; and the second metallic material may include: Pb (lead), Au (gold) or the like. Those skilled in the art will also appreciate that the materials for the formation of the source and drain are exemplary only. The scope of the present invention is not limited thereto.

In another embodiment, the method further includes, before forming the source electrode and the drain electrode on a portion of the insulating layer and surrounding the source region and the drain region, doping the source region 2071 and the drain region 2072 to the same conductivity types, followed by forming the source electrode and the drain electrode surrounding the source region and the drain region, respectively.

In an embodiment of the present invention, in the step of doping the source region and the drain region, if the channel region of the carbon nanotube is of the intrinsic type, the source region and the drain region may be both lightly doped n-type or p-type, or may be both heavily doped n+ type or p+ type; or, if the channel region is lightly doped n-type, the source and drain regions may be both heavily doped n+ type, or both lightly doped p-type or heavily doped p+ type; or, if the channel region is lightly doped p-type, the source and drain regions may be both heavily doped p+ type, or both lightly doped n-type or heavily doped n+ type.

Thus, a process of forming a carbon nanotube neuron device according to an embodiment of the present invention has been described. In the carbon nanotube neuron device formed by the above method, because the gate electrodes completely surround the channel region, the gate electrode in the carbon nanotube neuron device has enhanced control over the channel. Also, the short-channel effects are avoided; the device structure is simpler; and the manufacturing process is more optimized.

Figure 11A:
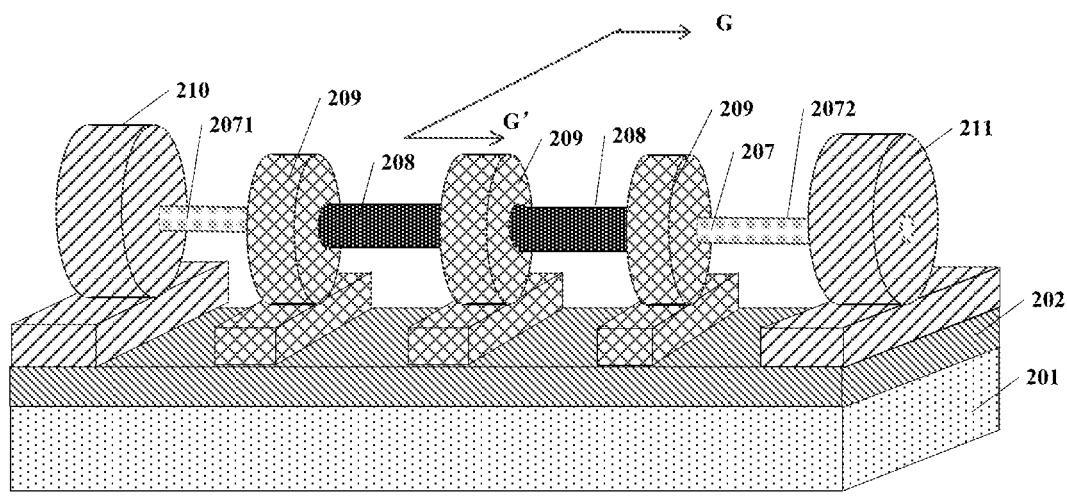
FIG. 11A is a schematic perspective view illustrating an intermediate stage of forming a carbon nanotube neuron device according to an embodiment of the present invention.
Figure 11B:
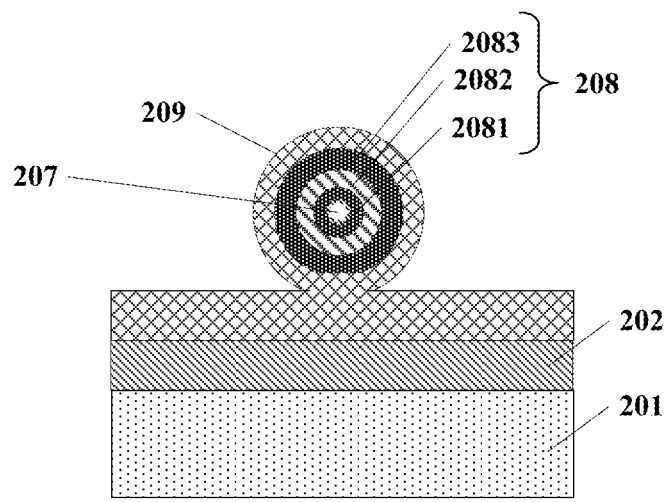
FIG. 11B is a schematic cross-sectional view along the G-G' direction of FIG. 11A, illustrating an intermediate stage of forming a carbon nanotube neuron device according to an embodiment of the present invention.
Figure 12A:
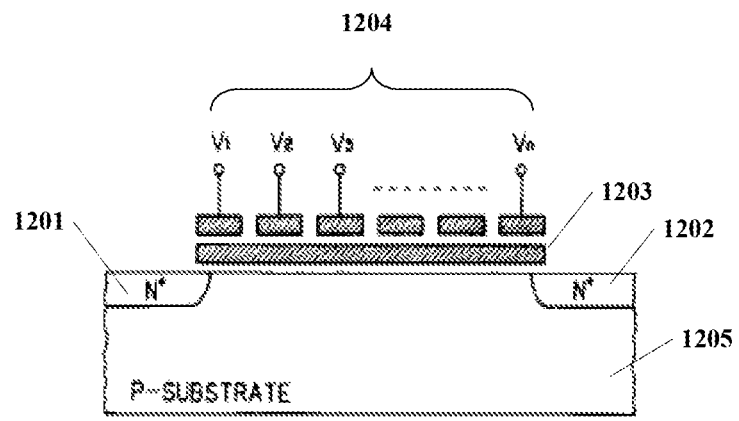
FIG. 12A shows a schematic diagram of a neuron MOS transistor.
Figure 12B:
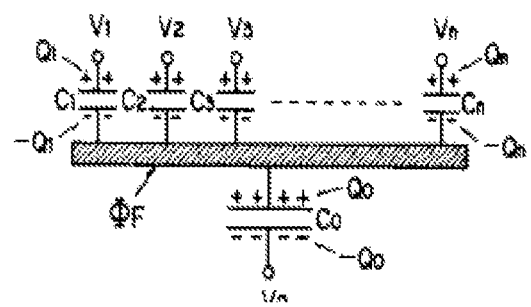
FIG. 12B shows an equivalent circuit diagram of a neuron MOS transistor with a floating gate and a plurality of input gates.
Figure 12C:
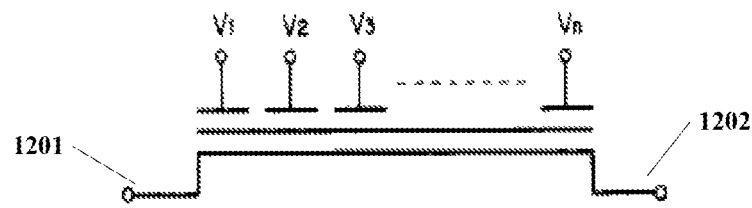
FIG. 12C shows a simplified schematic diagram of a neuron MOS transistor.

FIG. 11A is a schematic perspective view showing a carbon nanotube neuron device according to some embodiments of the present invention. FIG. 11B is a schematic cross-sectional view of the carbon nanotube neuron device along the direction of G-G' shown in FIG. 11A.

As shown in FIGS. 11A and 11B, the carbon nanotube neuron device includes: a substrate 201 (e.g., a silicon substrate); an insulating layer 202 (e.g., silica) formed on the substrate 201; and a carbon nanotube 207 formed above the insulating layer 202. The carbon nanotube includes a source region 2071 and a drain region 2072 at the two ends, and a channel region between the source region 2071 and drain region 2072. The source region and the drain region are doped to the same conductivity type. The carbon nanotube neuron device further includes a laminate structure 208 surrounding the channel. The laminate structure 208 includes, in the order from the inside to the outside, a first dielectric layer 2081, a conductive layer 2082, and a second dielectric layer 2083. The carbon nanotube neuron device further includes: a source electrode 210 and a drain electrode 211 on the insulating layer 202 and surrounding the source region 2071 and the drain region 2072, respectively (e.g., surrounding a portion of the drain region and a portion of the source region, respectively); two or more (e.g., three) gate electrodes 209 located above the insulating layer 202 and spaced apart from each other, each gate electrode 209 surrounding the laminate structure 208. Wherein, the carbon nanotube 207 is supported by the source electrode 210, the drain electrode 211, or the gate electrodes 209 to be located above the insulating layer 202.

In this embodiment, the neuron device uses a carbon nanotube as the channel region, the source region, and the drain region. Furthermore, the neuron device includes a laminate structure surrounding the channel region, a plurality of gate electrodes surrounding the laminate structure as multiple input gates, and a source electrode and a drain electrode surrounding the source region and the drain region of the carbon nanotube, respectively. The carbon nanotube is supported by the source electrode, the drain electrode, or the gate electrodes to be located above the insulating layer. As such, the gates of the neuron device have enhanced control over the channel. In addition, the short-channel effects are avoided; the device structure is simpler; and the manufacturing process is more optimized.

In an embodiment of the present invention, the channel region is of the intrinsic type. The source region and the drain region are lightly doped n-type or p-type, or are heavily doped n+ type or p+ type. In another embodiment, the channel region is lightly doped n-type, the source region and the drain region are heavily doped n+ type, or are lightly doped p-type or heavily doped p+ type. In yet another embodiment, the channel region is lightly doped p-type, and the source region and the drain region are heavily doped p+ type, or are lightly doped n-type or heavily doped n+ type.

In the following, the operation of the carbon nanotube neuron device is described according to an exemplary embodiment where the channel region is of the intrinsic type, and the source and drain regions are n-type. The source electrode 210 is grounded. The drain electrode 211 is connected to the positive terminal of a power supply. Each gate electrode 209 serves as an input electrode of the input signal. When each gate 209 voltage is not applied, because of the potential barrier between the source region and the channel region of the carbon nanotube, electrons cannot reach the channel region from the source region, nor can the holes reach the source region from the channel region; therefore the source region and the drain region of the carbon nanotube neuron device are non-conducting with respect to each other. When at least one gate electrode 209 is connected to a high voltage, for example, if the three gate electrodes shown in FIG. 11A are connected to positive voltages $V_1$, $V_2$, and $V_3$, respectively, the electric potential $\phi_F$ of the conductive layer 2082 (i.e., floating gate) is the weighted sum of the three voltages. The electric potential $\phi_F$ is applied to the channel region of the carbon nanotube, such that the potential barrier between the source region and the channel region is reduced, thereby there is a presence of electrons flowing from the source region into the channel region and into the drain region, and there is a presence of holes flowing from the drain region into the channel region and into the source region; thus, there is conduction between the source region and the drain region of the carbon nanotube neuron device. Of course, one skilled in the art can understand how to implement the technical solutions disclosed herein from the above description to different types of doped source region, channel region and drain region, or where different voltages are applied to the electrodes.

In an embodiment of the present invention, the carbon nanotube may have a length of 50 to 500 nm, e.g., 100 nm, 200 nm, 300 nm, or 400 nm. The length of the spacing between adjacent gate electrodes may be 10 to 50 nm, such as 20 nm, 30 nm, or 40 nm. The carbon nanotube may have a diameter of 1 to 3 nm, e.g., 1.5 nm, 2 nm, or 2.5 nm.

In an embodiment of the present invention, and the thicknesses of the first dielectric layer and second dielectric layer may be 1 to 3 nm, e.g., 1.5 nm, 2 nm or 2.5 nm. The thickness of the conductive layer may be 2 to 10 nm, for example 3 nm, 5 nm, or 8 nm. The first dielectric layer and the second dielectric layer may be a high dielectric constant dielectric material (i.e., a high k dielectric material). The conductive layer may be polysilicon or a metal material (e.g., aluminum, tungsten, etc.).

In an embodiment of the present invention, as shown in FIGS. 10A and 10B, the carbon nanotube neuron device further includes: from bottom to top, a first dielectric layer 2081, a conductive layer 2082, and a second dielectric layer 2083 located between each gate electrode 209 and the insulating layer 202.

Thus, exemplary embodiments have described a semiconductor device and method for manufacturing the same in detail. In order to not obfuscate teachings of the present invention, well-known methods, procedures, and components have not been described in detail. It will be clear to those skilled in the art, after reading the present disclosure, how to make and use alternative embodiments of the invention to manufacture a semiconductor device.

While the invention has been described in terms of various specific embodiments, those of skill in the art will recognize that many modifications can be made to adapt to a particular application or material to the teachings of the invention. For example, the above-described embodiments may be used in combination with each other. Therefore, the appended claims should be construed broadly to include variants and embodiments of the invention.

What is claimed is:

1. A carbon nanotube neuron device comprising:
   a substrate;
   an insulating layer formed on the substrate;
   a carbon nanotube formed above the insulating layer, the carbon nanotube including a source region on one end thereof, a drain region on another end thereof, and a channel region between the source region and the drain region, wherein the source region and the drain region are doped to a same conductivity type;
   a laminate structure surrounding the channel region, the laminate structure including, from inside to outside, a first dielectric layer, a conductive layer, and a second dielectric layer;
   a source electrode and a drain electrode disposed above the insulating layer, and surrounding the source region and the drain region, respectively; and
   a plurality of gate electrodes spaced apart from each other and disposed above the insulating layer, each gate electrode surrounding the laminate structure that surrounds the channel region;
   wherein the carbon nanotube is disposed above the insulating layer and supported by the source electrode, the drain electrode, or the plurality of gate electrodes.

2. The carbon nanotube neuron device of claim 1, wherein:
   the channel region is of intrinsic type, and the source region and the drain region are both lightly doped n-type, or both lightly doped p-type, or both heavily doped n+ type, or both heavily doped p+ type; or
   the channel region is lightly doped n-type, and the source region and the drain region are both heavily doped n+ type, or both lightly doped p-type, or both heavily doped p+ type; or
   the channel region is lightly doped p-type, and the source region and the drain region are both heavily doped p+ type, or both lightly doped n-type, or both heavily doped n+ type.

3. The carbon nanotube neuron device of claim 1, further comprising: disposed between each gate electrode and the insulating layer, from bottom to top, a third dielectric layer, a second conductive layer, and a fourth dielectric layer.

4. The carbon nanotube neuron device of claim 1, wherein the carbon nanotube has a length ranging from about 50 nm to about 500 nm, and a spacing between adjacent gate electrodes ranges from about 10 nm to about 50 nm.

5. The carbon nanotube neuron device of claim 1, wherein each of the first dielectric layer and the second dielectric layer has a thickness ranging from about 1 nm to about 3 nm, and the conductive layer has a thickness ranging from about 2 nm to about 10 nm.

6. The carbon nanotube neuron device of claim 1, wherein the carbon nanotube has a diameter ranging from about 1 nm to about 3 nm.

7. The carbon nanotube neuron device of claim 1, wherein the first dielectric layer and the second dielectric layer comprises a high-k dielectric material, and the conductive layer comprises polycrystalline silicon or a metal material.

8. A method of forming a carbon nanotube neuron device, the method comprising:
   providing a substrate;
   forming an insulating layer on the substrate;
   forming a carbon nanotube above the insulating layer;

forming a laminate structure surrounding the carbon nanotube, the laminate structure including, from inside to outside, a first dielectric layer, a conductive layer, and a second dielectric layer;

forming a plurality of gate electrodes spaced apart from each other and disposed above the insulating layer, each gate electrode surrounding the laminate structure;

removing a portion of the laminate structure surrounding each end of the carbon nanotube to form a source region and a drain region in each end of the carbon nanotube, respectively;

forming a source electrode surrounding the source region and located above the insulating layer; and forming a drain electrode surrounding the drain region and located above the insulating layer;

wherein the carbon nanotube is disposed above the insulating layer and supported by the source electrode, the drain electrode, or the plurality of gate electrodes.

9. The method of claim 8, wherein forming the laminate structure surrounding the carbon nanotube comprises:

forming the first dielectric layer surrounding the carbon nanotube using atomic layer deposition;

forming the conductive layer surrounding the first dielectric layer using low pressure chemical vapor deposition; and forming the second dielectric layer surrounding the conductive layer using atomic layer deposition.

10. The method of claim 8, wherein the first dielectric layer and the second dielectric layer comprises a high-k dielectric material, and the conductive layer comprises polycrystalline silicon or a metal material.

11. The method of claim 8, further comprising: before forming the source electrode and the drain electrode, doping the source region and the drain region to a same conductivity type.

12. The method of claim 8, wherein forming the carbon nanotube above the insulating layer comprises:

forming a porous silicon layer on the insulating layer;

forming a photoresist layer with an opening on the porous silicon layer;

applying a metal catalyst solution through the opening;

baking the metal catalyst solution to form metal nanoparticles on the porous silicon layer;

removing the photoresist layer;

causing a chemical reaction between the metal nanoparticles and a carbon-based compound to form the carbon nanotube on the porous silicon layer; and removing a portion of the porous silicon layer to expose a portion of the insulating layer, such that the carbon nanotube is supported by a remaining portion of the porous silicon layer.

13. The method of claim 12, wherein the porous silicon layer has a thickness ranging from about 2 nm to about 10 nm.

14. The method of claim 12, wherein removing the portion of the laminate structure surrounding each end of the carbon nanotube includes removing the remaining portion of the porous silicon layer.

15. The method of claim 12, wherein causing a chemical reaction between the metal nanoparticles and a carbon-based compound to form the carbon nanotube includes adding ammonia to the carbon nanotube being formed to perform n-type doping, or adding borane to the carbon nanotube being formed to perform p-type doping.

16. The method of claim 12, wherein forming the laminate structure includes: forming a second laminate structure on the exposed portion of the insulating layer and the remaining portion of the porous silicon layer by:

forming a third dielectric layer on the exposed portion of the insulating layer and the remaining portion of the porous silicon layer;

forming a second conductive layer on the third dielectric layer; and forming a fourth dielectric layer on the second conductive layer.

17. The method of claim 16, wherein the plurality of gate electrodes spaced apart from each other are formed above the second laminate structure formed on the exposed portion of the insulating layer.

18. The method of claim 8, wherein forming the source electrode or the drain electrode comprises:

forming a contact surrounding the carbon nanotube in the source region or the drain region using a first metal material by an evaporation and lift-off process, thereby forming the source electrode or the drain electrode, wherein the first metallic material is in contact with the carbon nanotube such that the source region or the drain region of the carbon nanotube is lightly doped n-type or heavily doped n+ type; or forming a contact surrounding the carbon nanotube in the source region or the drain region using a second metal material by an evaporation and lift-off process, thereby forming the source electrode or the drain electrode, wherein the second metallic material is in contact with the carbon nanotube such that the source region or the drain region of the carbon nanotube is lightly doped p-type or heavily doped p+ type.

19. The method of claim 18, wherein the first metal material comprises Ca (calcium), Sc (scandium), or Y (yttrium); and the second metal material comprises Pb (lead), or Au (gold).

* * * * *